United States Patent
Chuang et al.

(10) Patent No.: US 10,134,807 B2
(45) Date of Patent: Nov. 20, 2018

(54) STRUCTURE AND FORMATION METHOD OF INTEGRATED CIRCUIT STRUCTURE

(71) Applicant: Taiwan Semiconductor Manufacturing Co., Ltd., Hsinchu (TW)

(72) Inventors: Harry-Hak-Lay Chuang, Singapore (SG); Hung-Cho Wang, Taipei (TW); Wen-Chun You, Dongshan Township, Yilan County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/460,902

(22) Filed: Mar. 16, 2017

(65) Prior Publication Data
US 2018/0166501 A1     Jun. 14, 2018

Related U.S. Application Data

(60) Provisional application No. 62/433,423, filed on Dec. 13, 2016.

(51) Int. Cl.
*H01L 29/82* (2006.01)
*H01L 27/22* (2006.01)
*H01L 43/08* (2006.01)
*H01L 43/12* (2006.01)

(52) U.S. Cl.
CPC ............ *H01L 27/226* (2013.01); *H01L 43/08* (2013.01); *H01L 43/12* (2013.01)

(58) Field of Classification Search
CPC ... H01L 27/2463; H01L 27/226; H01L 43/02; H01L 43/08; H01L 43/12; H01L 27/228; H01L 23/528; H01L 23/226
See application file for complete search history.

(56) References Cited

U.S. PATENT DOCUMENTS

| | | | | |
|---|---|---|---|---|
| 9,502,466 | B1* | 11/2016 | Chuang | H01L 27/222 |
| 9,754,883 | B1* | 9/2017 | Briggs | H01L 21/7685 |
| 2016/0322090 | A1* | 11/2016 | Chan | G11C 11/161 |
| 2017/0092693 | A1* | 3/2017 | Tan | H01L 27/228 |
| 2017/0104029 | A1* | 4/2017 | Li | H01L 27/228 |
| 2017/0170058 | A1* | 6/2017 | Rha | H01L 21/76816 |
| 2017/0263861 | A1* | 9/2017 | Park | H01L 43/12 |
| 2018/0083067 | A1* | 3/2018 | Kim | H01L 43/02 |

* cited by examiner

*Primary Examiner* — Stephen Bradley
*Assistant Examiner* — Wasiul Haider
(74) *Attorney, Agent, or Firm* — Birch, Stewart, Kolasch & Birch, LLP

(57) ABSTRACT

Integrated circuit structures and methods for forming the same are provided. An integrated circuit includes a dielectric layer in a memory region and a logic region. The integrated circuit structure also includes a first conductive feature in the dielectric layer in the memory region. The integrated circuit structure further includes a second conductive feature in the dielectric layer in the logic region. In addition, the integrated circuit structure includes an active memory cell over the dielectric layer in the memory region. The active memory cell is connected to the first conductive feature. The integrated circuit structure also includes a dummy memory cell over the dielectric layer in the logic region. The dummy memory cell is connected to the second conductive feature.

20 Claims, 16 Drawing Sheets

STRUCTURE AND FORMATION METHOD OF INTEGRATED CIRCUIT STRUCTURE

CROSS REFERENCE TO RELATED APPLICATIONS

This application claims the benefit of U.S. Provisional Application No. 62/433,423, filed on Dec. 13, 2016, the entirety of which is incorporated by reference herein.

BACKGROUND

The semiconductor integrated circuit (IC) industry has experienced rapid growth. Technological advances in IC materials and design have produced generations of ICs. Each generation has smaller and more complex circuits than the previous generation.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs. For example, the scaling-down process allows for memory and logic device structures to be integrated together in an IC chip.

However, these advances have increased the complexity of processing and manufacturing ICs. Since feature sizes continue to decrease, fabrication processes continue to become more difficult to perform. Therefore, it is a challenge to form reliable IC devices at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
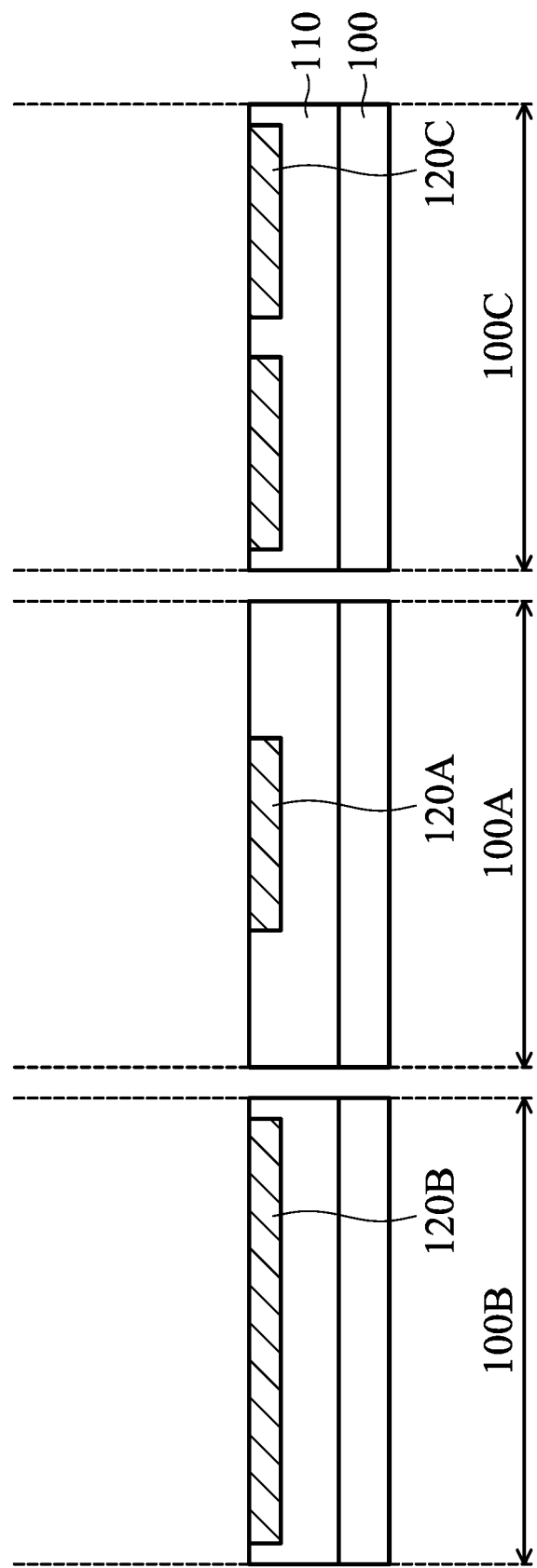
FIGS. 1A-1H are cross-sectional views of various stages of a process for forming an integrated circuit structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure relates to an integrated circuit structure including a memory element. The memory element is a magnetic random access memory (MRAM). However, it should be noted that MRAM is only an example and is not a limitation to the disclosure. The memory element may be a resistive random access memory (RRAM), phase change random access memory (PCRAM), or another suitable memory element.

Some embodiments of the disclosure are described. FIGS. 1A-1H are cross-sectional views of various stages of a process for forming an integrated circuit structure, in accordance with some embodiments. Additional operations can be provided before, during, and/or after the stages described in FIGS. 1A-1H. Some of the stages that are described can be replaced or eliminated for different embodiments. Additional features can be added to the integrated circuit structure. Some of the features described below can be replaced or eliminated for different embodiments.

As shown in FIG. 1A, a substrate 100 is provided. In some embodiments, the substrate 100 is a bulk semiconductor substrate, such as a semiconductor wafer. In some embodiments, the substrate 100 includes silicon or another elementary semiconductor material, such as germanium. In some other embodiments, the substrate 100 includes a compound semiconductor. The compound semiconductor may include silicon germanium, gallium arsenide, silicon carbide, indium arsenide, indium phosphide, another suitable compound semiconductor, or a combination thereof.

In some embodiments, the substrate 100 is a semiconductor-on-insulator (SOI) substrate. The SOI substrate may be fabricated using a wafer bonding process, a silicon film transfer process, a separation by implantation of oxygen (SIMOX) process, another applicable method, or a combination thereof.

In some embodiments, isolation features (not shown) are formed in the substrate 100, and various device elements (not shown) are formed in and/or over the substrate 100. The isolation features are used to define active regions and electrically isolate the various device elements in different active regions. In some embodiments, the isolation features include shallow trench isolation (STI) features, local oxidation of silicon (LOCOS) features, other suitable isolation features, or a combination thereof. Examples of the various device elements include transistors, diodes, other suitable elements, and combinations thereof. For example, the transistors may be metal oxide semiconductor field effect transistors (MOSFET), complementary metal oxide semiconductor (CMOS) transistors, bipolar junction transistors (BJT), high voltage transistors, high-frequency transistors, p-channel and/or n-channel field effect transistors (PFETs/NFETs), etc. Various processes are performed to form the various device elements, such as front-end-of-line (FEOL) semiconductor fabrication processes. FEOL semiconductor fabrication processes include deposition, etching, implantation, photolithography, annealing, planarization, another applicable process, or a combination thereof.

However, embodiments of the disclosure are not limited thereto. In some other embodiments, no transistor or diode is formed in and/or over the substrate 100. In other words, embodiments of the disclosure are not limited to an integrated circuit structure including an embedded memory element.

As shown in FIG. 1A, the substrate 100 includes a memory region 100A and peripheral regions 100B and 100C, in accordance with some embodiments. The memory region 100A is adjacent to or adjoins the peripheral regions 100B and 100C. In some embodiments, the memory region 100A is surrounded by the peripheral regions 100B and 100C.

Multiple memory cells or units, which will be described in more detail later, are configured to be formed in the memory region 100A. The active memory cells or units may be arranged in an array in the memory region 100A. Various circuits, which will be described in more detail later, are configured to be formed in the peripheral regions 100B and 100C. Examples of the various circuits include logic circuits, test circuits, monitor circuits, processor circuits, other suitable circuits, and combinations thereof. Each of the peripheral regions 100B and 100C may be referred to as a logic region or a test region (such as a test line region). The logic region can support the operation of memory cells or units in the memory region 100A.

In some embodiments, an interconnection structure is subsequently formed on the substrate 100. The interconnection structure includes an interlayer dielectric (ILD) layer, inter-metal dielectric (IMD) layers, and multiple conductive features in the ILD and IMD layers. The ILD layer may include multiple dielectric sub-layers. The conductive features may include conductive contacts, conductive lines, conductive vias and/or conductive pads. Various processes are performed to form the interconnection structure, such as back-end-of-line (BEOL) semiconductor fabrication processes. In some embodiments, various device elements (not shown) in and/or over the substrate 100 are covered by the ILD and IMD layers and electrically connected to the conductive features in the ILD and IMD layers.

As shown in FIG. 1A, a dielectric layer 110 is deposited over the substrate 100 in the memory region 100A and the peripheral regions 100B and 100C, in accordance with some embodiments. The dielectric layer 110 may serve as an ILD layer of an interconnection structure or a dielectric sub-layer of the ILD layer. Alternatively, the dielectric layer 110 may have a multi-layer structure, which includes ILD and IMD layers of an interconnection structure.

In some embodiments, the dielectric layer 110 is made of silicon oxide, borosilicate glass (BSG), phosphoric silicate glass (PSG), borophosphosilicate glass (BPSG), fluorinated silicate glass (FSG), porous dielectric material, another suitable low-k dielectric material, or a combination thereof. The material of the dielectric layer 110 is selected to minimize size, propagation delays, and crosstalk between nearby conductive features. In some embodiments, the dielectric layer 110 is deposited using a chemical vapor deposition (CVD) process, a spin-on process, a spray coating process, another applicable process, or a combination thereof.

For the purpose of simplicity and clarity, FIG. 1A shows that the dielectric layer 110 has substantially the same height and substantially even surface topography or profile in the memory region 100A and the peripheral regions 100B and 100C. However, it should be noted that the surface topography or profile shown in figures is only an example and is not a limitation to the disclosure.

In some other embodiments, there are different pattern densities over the substrate 100 in the memory region 100A and the peripheral regions 100B and 100C. Pattern density refers to the number of features that are located within a given region or area. As a result, the dielectric layer 110 has different heights and non-uniform surface topography in the memory region 100A and the peripheral regions 100B and 100C. The dielectric layer 110 may be higher in the memory region 100A than the peripheral region 100C. The dielectric layer 110 may be lower in the memory region 100A than the peripheral region 100B. For example, the height difference may be in a range from about 600 Å to about 1100 Å, but it is not a limitation to the disclosure.

Afterwards, multiple conductive features are formed in the dielectric layer 110. As shown in FIG. 1A, conductive features including a conductive feature 120A are formed in the dielectric layer 110 in the memory region 100A. In some embodiments, the conductive features in the memory region 100A (such as the conductive feature 120A) include conductive lines, conductive pads or other suitable conductive features. The conductive feature 120A is an active conductive feature.

As shown in FIG. 1A, conductive features including a conductive feature 120B are formed in the dielectric layer 110 in the peripheral region 100B. In some embodiments, the conductive features in the peripheral region 100B (such as the conductive feature 120B) include conductive pads, conductive lines, or other suitable conductive features. Examples of the conductive features in the peripheral region 100B include input/output (I/O) pads, bonding pads, probe test pads, monitor pads, and other suitable conductive features. The I/O pads may be signal pads or power/ground (P/G) pads. The conductive feature 120B may be an active or dummy conductive feature. For example, the conductive feature 120B may be electrically isolated from the conductive feature 120A.

As shown in FIG. 1A, conductive features 120C are formed in the dielectric layer 110 in the peripheral region 100C. In some embodiments, the conductive features 120C may include conductive lines, conductive pads, or other suitable conductive features. In some embodiments, the conductive features 120C are active or dummy conductive features. In some other embodiments, one of the conductive features 120C is an active conductive feature while another of the conductive features 120C is a dummy conductive feature. As a result, one of the conductive features 120C is electrically connected to the conductive feature 120A while another of the conductive features 120C is electrically isolated from the conductive feature 120A.

In some embodiments, the area or width of the conductive feature 120B is greater than that of the conductive features 120A and 120C, but embodiments of the disclosure are not limited thereto. In some embodiments, the conductive features 120A, 120B and 120C are at substantially the same level in the dielectric layer 110. In some embodiments, the conductive features 120A, 120B and 120C have substantially coplanar top and bottom surfaces. The conductive features 120A, 120B and 120C may be positioned at topographies with different heights.

As mentioned above, the dielectric layer 110 may serve as a dielectric sub-layer of an ILD layer or include ILD and IMD layers of an interconnection structure. In these embodiments, there are one or more interconnection features (not shown) in the dielectric layer 110 and below the conductive features 120A, 120B and 120C. For example, there may be one or more conductive layers (not shown) below the conductive features 120A, 120B and 120C. The one or more conductive layers may extend across the memory region 100A and the peripheral regions 100B and 100C. There may also be conductive vias (not shown) between these conductive layers and the conductive features 120A, 120B and 120C to construct electrical connection paths in the dielectric layer 110.

Figure 1B:
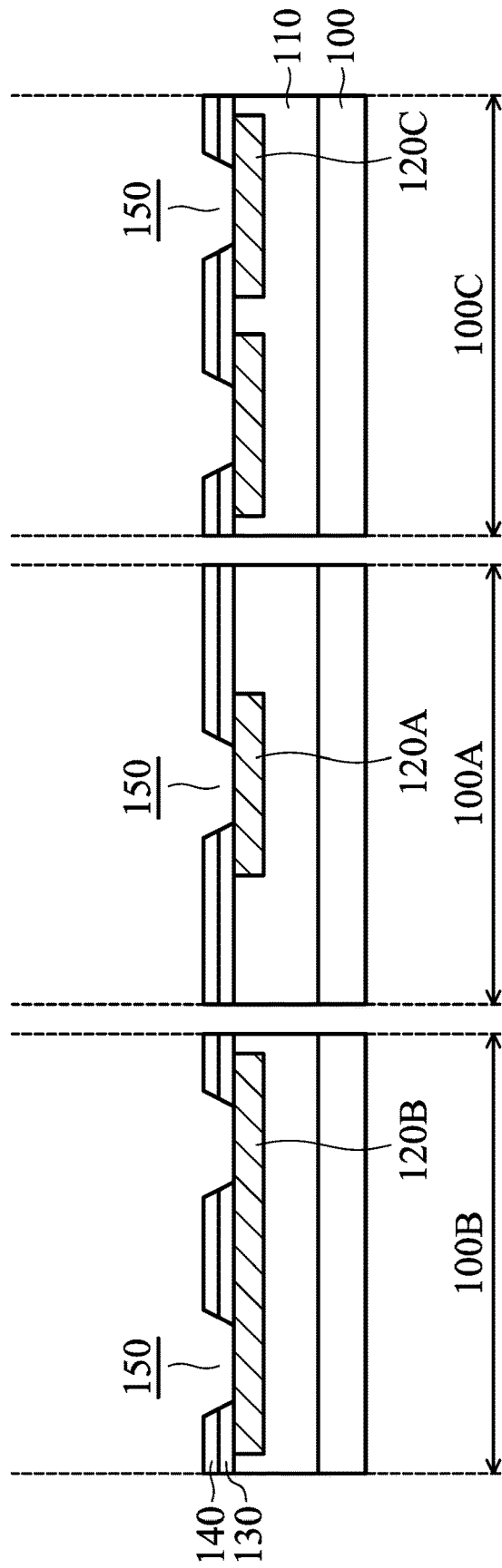

As shown in FIG. 1B, an anti-reflective layer 130 and a dielectric layer 140 are sequentially deposited over the dielectric layer 110 in the memory region 100A and the peripheral regions 100B and 100C, in accordance with some embodiments. The anti-reflective layer 130 may also serve as a stop layer during a subsequent etching process. In some embodiments, the anti-reflective layer 130 is made of silicon-carbide (SiC), another anti-reflective material, or another suitable dielectric material. In some embodiments, the anti-reflective layer 130 is deposited using a CVD process, another applicable process, or a combination thereof.

The dielectric layer 140 serves as a stop layer of a planarization process, which will be described in more detail later. The dielectric layer 140 protects features and layers under the dielectric layer 140 from being removed during a subsequent planarization process. In some embodiments, the dielectric layer 140 is made of silicon oxide, another suitable material, or a combination thereof. In some embodiments, the dielectric layer 140 is made of a material which is hardly removed during a subsequent planarization process. More specifically, the dielectric layer 140 may be polished by polishing slurry used in a subsequent planarization process at a very low polishing rate. For example, the dielectric layer 140 may be a silicon rich oxide (SRO) layer. In some embodiments, the dielectric layer 140 is deposited using a CVD process, another applicable process, or a combination thereof.

Afterwards, openings 150 are formed in the memory region 100A and the peripheral regions 100B and 100C, as shown in FIG. 1B in accordance with some embodiments. The openings 150 penetrate through the anti-reflective layer 130 and the dielectric layer 140 to partially expose the conductive features 120A, 120B and 120C. In some embodiments, each of the conductive features 120A and 120C is partially exposed through one of the openings 150 while the conductive feature 120B is partially exposed through two or more of the openings 150. In some other embodiments, each of the conductive features 120A, 120B and 120C is partially exposed through one of the openings 150. The openings 150 may be referred to as via holes. In some embodiments, the openings 150 are formed using photolithography and etching processes, another applicable process, or a combination thereof.

Figure 1C:
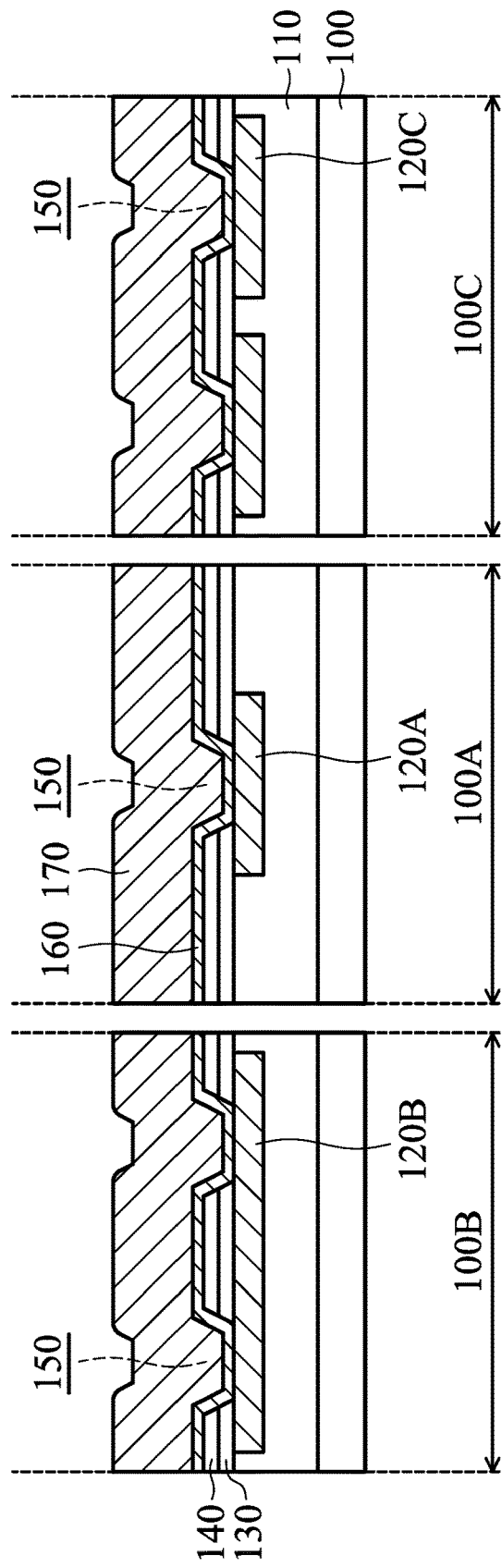

As shown in FIG. 1C, a barrier layer 160 is deposited over the dielectric layer 140 in the memory region 100A and the peripheral regions 100B and 100C, in accordance with some embodiments. The barrier layer 160 extends into the openings 150 without filling up the openings 150. The barrier layer 160 prevents diffusion between the conductive features 120A, 120B and 120C and subsequently formed electrodes, which will be described in more detail later.

In some embodiments, the barrier layer 160 includes tantalum nitride (TaN) and may have a thickness of about 10 Å. In some other embodiments, the barrier layer 160 includes tantalum (Ta) and may have a thickness of about 70 Å. It should be noted that the thickness of the barrier layer 160 is only an example and is not a limitation to the disclosure. In some other embodiments, the barrier layer 160 includes a conductive oxide, nitride, or oxynitride of a selected metal. In some embodiments, the barrier layer 160 is deposited using a CVD process, an atomic layer deposition (ALD) process, a physical vapor deposition (PVD) process, another applicable process, or a combination thereof.

As shown in FIG. 1C, a conductive layer 170 is deposited over the barrier layer 160 in the memory region 100A and the peripheral regions 100B and 100C, in accordance with some embodiments. The conductive layer 170 fills up the openings 150. In some embodiments, the barrier layer 160 is sandwiched between the conductive layer 170 and one of the conductive features 120A, 120B and 120C.

In some embodiments, the conductive layer 170 includes a metal nitride, a metal, or another suitable conductive material. Examples of the metal nitride include titanium nitride (TiN) and TaN. Examples of the metal include copper (Cu), aluminum (Al), tungsten (W), Ti and Ta. In some embodiments, the conductive layer 170 is deposited using a CVD process, an ALD process, a PVD process, another applicable process, or a combination thereof.

In some embodiments, the conductive layer 170 is conformally deposited over the barrier layer 160. As a result, the conductive layer 170 may be recessed at positions corresponding to the openings 150. As mentioned above, in some embodiments, the dielectric layer 110 has different heights and a non-uniform surface topography in the memory region 100A and the peripheral regions 100B and 100C. As a result, the conductive layer 170, which is conformably deposited over the dielectric layer 110, may have uneven surface topography in the memory region 100A and the peripheral regions 100B and 100C.

Figure 1D:
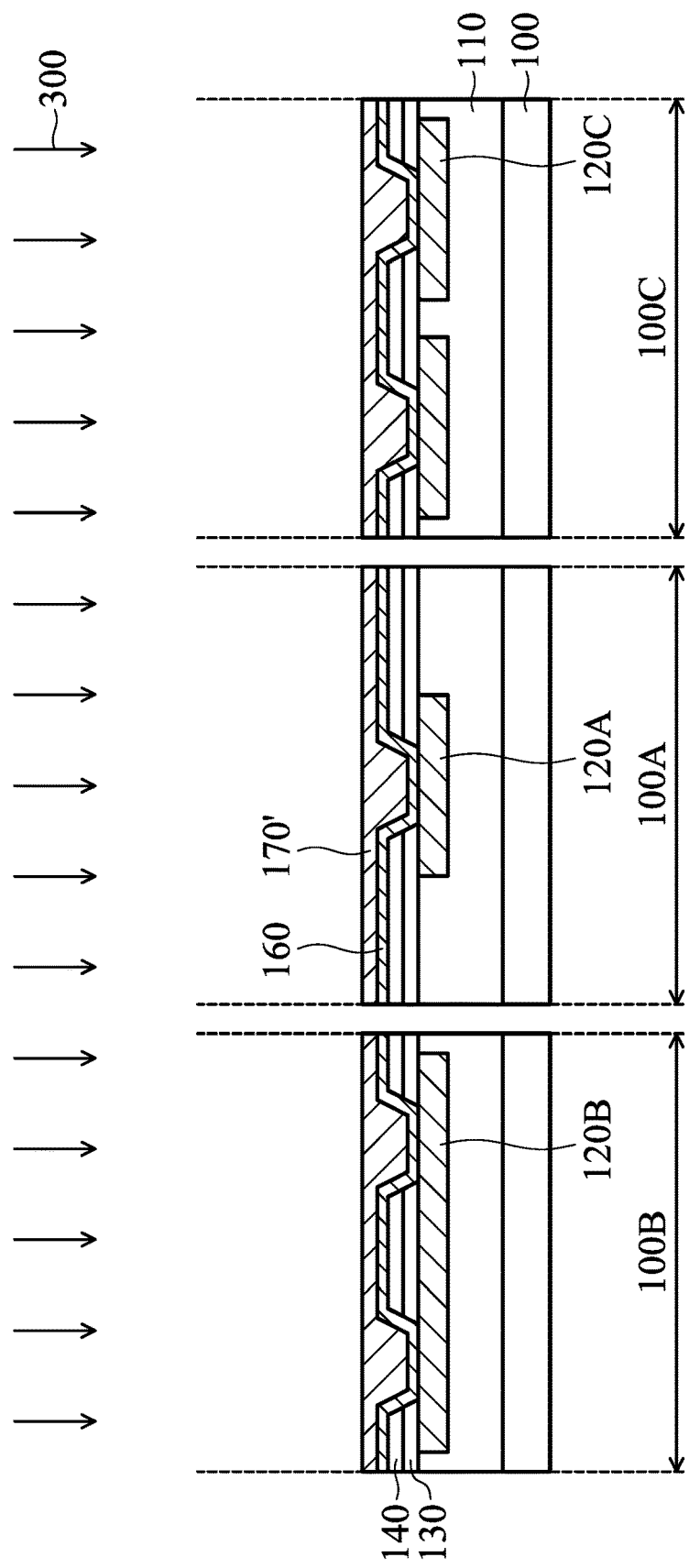

Afterwards, a planarization process 300 is performed over the conductive layer 170, as shown in FIG. 1D in accordance with some embodiments. The conductive layer 170 is partially removed and thinned until a planarized conductive layer 170' is formed. In some embodiments, the dielectric layer 140 remains covered during the planarization process 300. For example, the dielectric layer 140 is covered by the barrier layer 160 and the conductive layer 170'. In some embodiments, the conductive layer 170' has a substantially uniform and co-planar surface topography in the memory region 100A and the peripheral regions 100B and 100C.

The planarization process 300 may include a chemical mechanical polishing (CMP) process, another applicable process, or a combination thereof. In some embodiments, the polishing slurry used in the planarization process 300 includes abrasives (e.g., polishing agents), additives (e.g., surfactants), or a combination thereof. The abrasives may include $SiO_2$ particles, $Al_2O_3$ particles, other suitable particles or a combination thereof.

In some cases, a loading effect may occur during a planarization process as a result of differences in structural integrity and/or topography. For example, compared to a logic region, a memory region has a relatively high structural integrity and tends to resist polishing relatively well. Since the logic region is structurally weaker than the memory region, a conductive feature in the logic region may protrude or may be exposed and damaged when a planarization process is performed over the entire memory and logic regions. A dielectric layer in the logic region may also be consumed undesirably. On the other hand, in order to avoid damage to a conductive feature in the logic region, the planarization process may not result in a planar surface in the entire memory and logic regions.

According to some embodiments of the disclosure, for the purpose of reducing or eliminating the loading effect, the openings 150, the barrier layer 160 and the conductive layer 170 are formed in not only the memory region 100A but also the peripheral regions 100B and 100C. As a result, a sufficiently flat conductive layer 170' can be formed in the memory region 100A and the peripheral regions 100B and 100C after the planarization process 300. Furthermore, the memory region 100A and the peripheral regions 100B and 100C may have similar or substantially the same structural integrity. The memory region 100A and the peripheral regions 100B and 100C may have similar or substantially the same polishing level during the planarization process 300. The conductive features 120B and 120C are prevented from being exposed and damaged during the planarization process 300. Accordingly, short circuiting and/or high current leakage, which may be induced by a loading effect during a planarization process, are mitigated or eliminated. Therefore, the reliability of the integrated circuit structure is significantly enhanced.

Figure 1E:
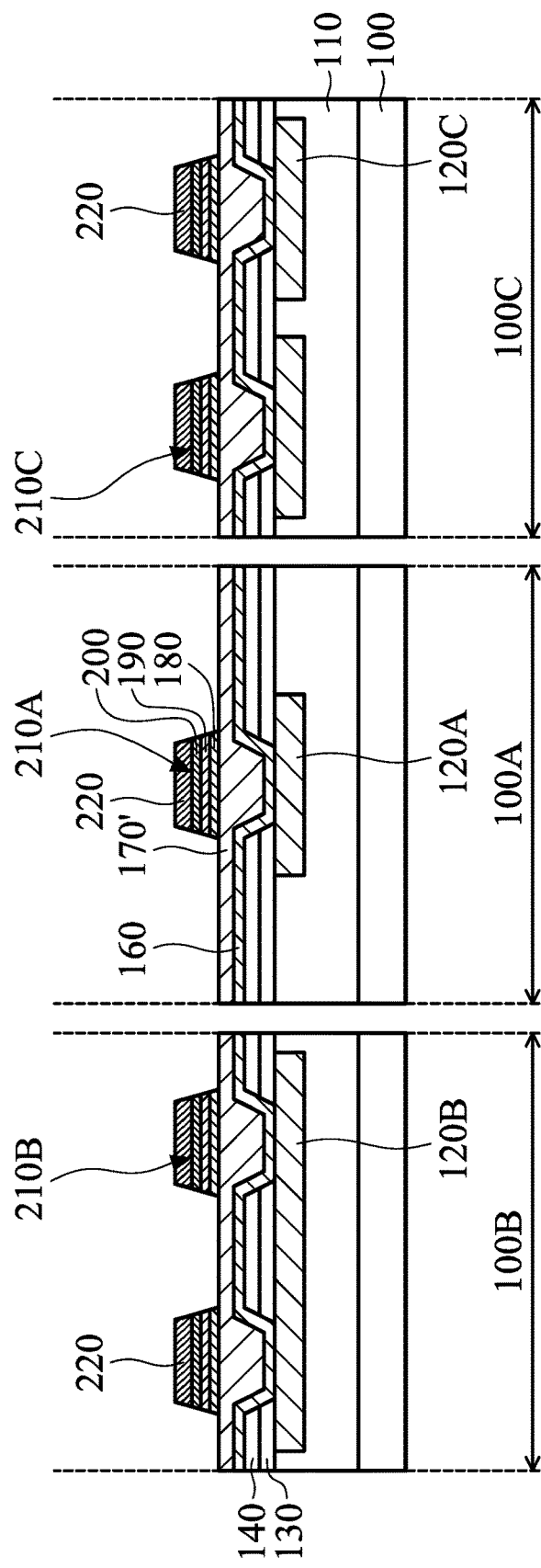

After the planarization process 300, multiple memory elements including a memory element 210A and top electrodes including a top electrode 220 are formed over the conductive layer 170' in the memory region 100A, as shown in FIG. 1E. The top electrode 220 covers the memory element 210A. In some embodiments, the memory elements in the memory region 100A (such as the memory element 210A) have a magnetic tunnel junction (MTJ) structure or another suitable structure. The memory element 210A may be referred to as a MTJ element.

More specifically, the memory element 210A includes a bottom ferromagnetic layer 180, a tunnel barrier layer 190, and a top ferromagnetic layer 200. The tunnel barrier layer 190 is between the bottom ferromagnetic layer 180 and the top ferromagnetic layer 200. The bottom ferromagnetic layer 180 may be referred to as a pinned layer. The top ferromagnetic layer 200 may be referred to as a free layer. The memory element 210A uses tunnel magnetoresistance (TMR) to store magnetic fields on the bottom ferromagnetic layer 180 and the top ferromagnetic layer 200. The electrical resistance of the memory element 210A changes in accordance with magnetic fields stored on the bottom ferromagnetic layer 180 and the top ferromagnetic layer 200, due to the magnetic tunnel effect.

In some embodiments, the bottom ferromagnetic layer 180 is made of iridium manganese (IrMn), platinum manganese (PtMn), iron manganese (FeMn), ruthenium manganese (RuMn), nickel manganese (NiMn), palladium platinum manganese (PdPtMn), or another suitable material. In some embodiments, the tunnel barrier layer 190 is made of PtMn or another suitable material. In some embodiments, the top ferromagnetic layer 200 is made of cobalt-iron-boron (CoFeB), magnesium oxide (MgO), or another suitable material.

In some embodiments, the top electrode 220 includes a metal nitride, a metal, or another suitable conductive material. Examples of the metal nitride include TiN and TaN. Examples of the metal include Cu, Al, W, Ti and Ta. In some embodiments, the top electrode 220 is deposited using a CVD process, an ALD process, a PVD process, another applicable process, or a combination thereof.

As shown in FIG. 1E, multiple memory elements 210B and 210C and more top electrodes 220 are formed over the conductive layer 170' in the peripheral regions 100B and 100C, in accordance with some embodiments. The top electrodes 220 in the peripheral regions 100B and 100C cover the memory elements 210B and 210C, respectively.

In some embodiments, the memory elements 210B and 210C are dummy while the memory element 210A is active. The dummy memory elements 210B and 210C and the active memory element 210A are at substantially the same level. The dummy memory elements 210B and 210C provide sufficient structural rigidity and support in the peripheral regions 100B and 100C to protect the conductive features 120B and 120C from damage during manufacturing, such as during a subsequent planarization process.

In some embodiments, the configuration of the memory elements 210B and 210C is similar to or substantially the same as the described configuration of the memory element 210A, and are therefore not repeated. The memory elements 210B and 210C may be referred to as MTJ elements. In some embodiments, the memory elements 210A, 210B and 210C are made of the same material. In some embodiments, the memory elements 210A, 210B and 210C are simultaneously formed using the same process at the same stage.

Figure 1F:
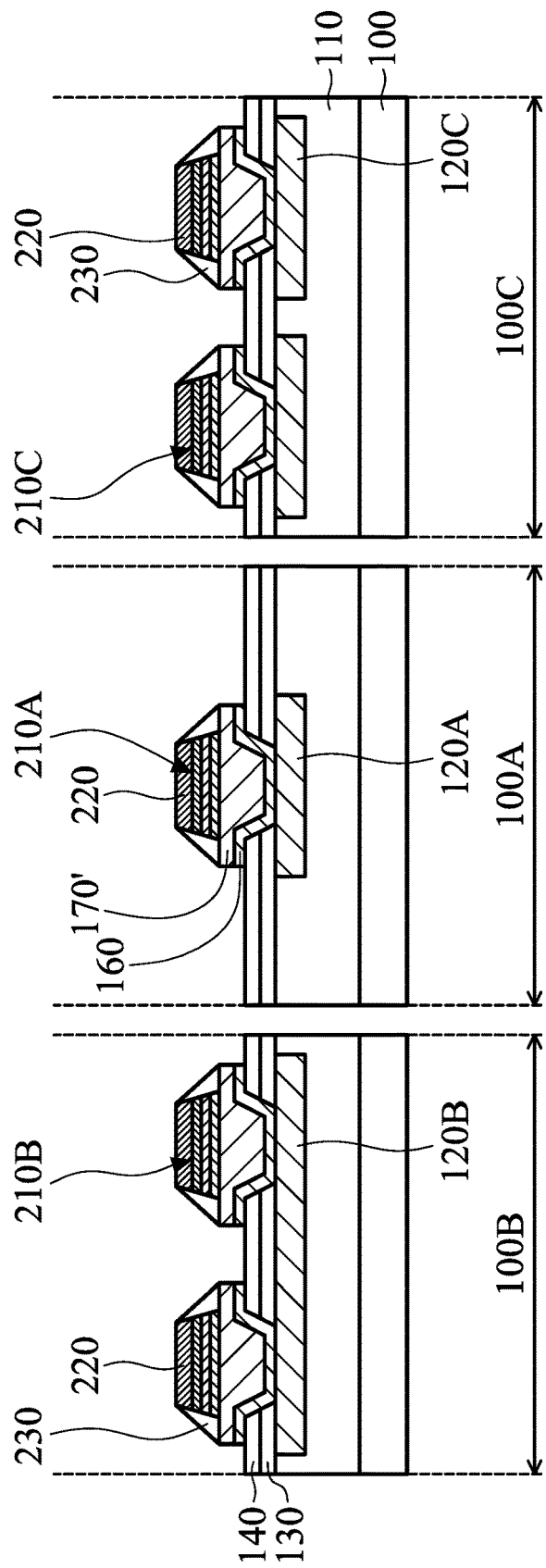

As shown in FIG. 1F, spacers 230 are formed over the conductive layer 170' in the memory region 100A and the peripheral regions 100B and 100C, in accordance with some embodiments. The spacers 230 cover sidewalls of the memory elements 210A, 210B and 210C and the top electrodes 220. In some embodiments, the spacers 230 are made of silicon nitride, silicon oxide, silicon oxynitride, or another suitable dielectric material for isolation.

Afterwards, the conductive layer 170' and the barrier layer 160 are partially removed and patterned, as shown in FIG. 1F in accordance with some embodiments. As a result, the dielectric layer 140 is exposed. The patterned conductive layer 170' may be patterned into multiple bottom electrodes in the memory region 100A and the peripheral regions 100B and 100C. Accordingly, the patterned conductive layer 170' may be referred to as a bottom electrode. Alternatively, the combination of the conductive layer 170' and the barrier layer 160 may be referred to as a bottom electrode. In some embodiments, the conductive layer 170' and the barrier layer 160 are wider than the top electrodes 220 and the memory elements 210A, 210B and 210C.

In some embodiments, the conductive layer 170' and the barrier layer 160 are etched and patterned using the top electrodes 220, the memory elements 210A, 210B and 210C and the spacers 230 as an etching mask. The memory elements 210B and 210C can protect the conductive layer 170' and the barrier layer 160 in the peripheral regions 100B and 100C from being etched and damaged.

Figure 1G:
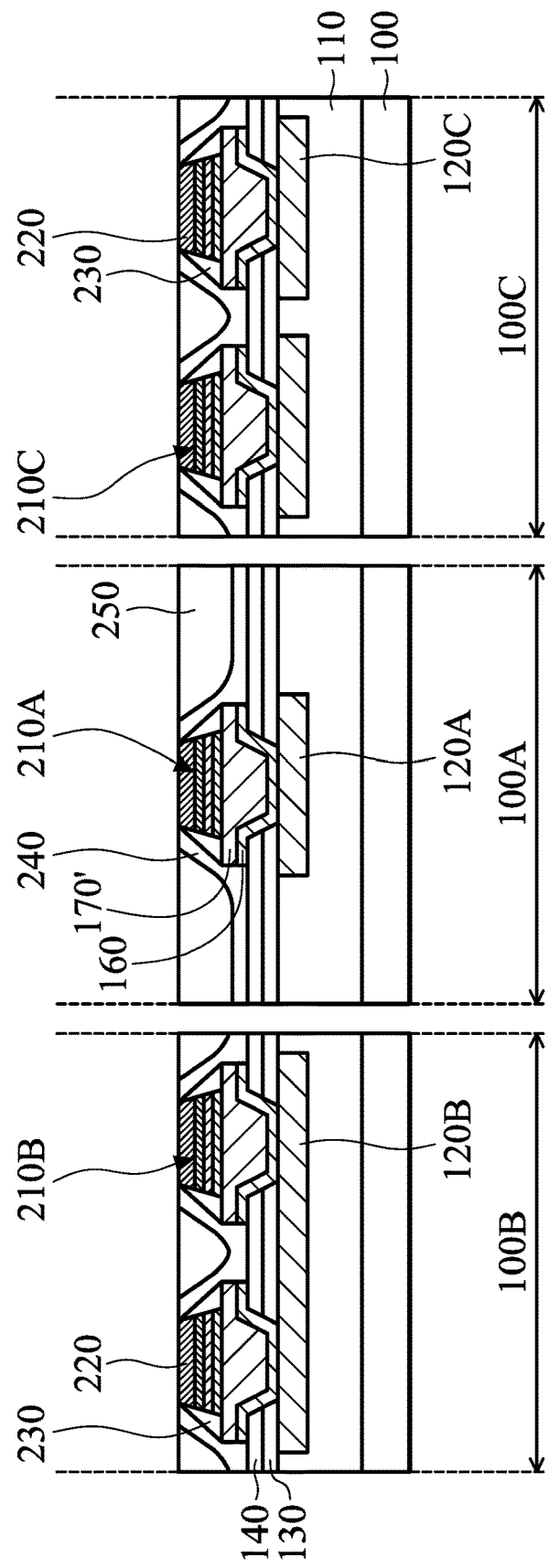

As shown in FIG. 1G, a cap layer 240 and a dielectric layer 250 are sequentially deposited in the memory region 100A and the peripheral regions 100B and 100C, in accordance with some embodiments. The cap layer 240 may serve as an anti-reflective layer. In some embodiments, the cap layer 240 covers the spacers 230, the sidewalls of the top electrodes 220, and the dielectric layer 140. The dielectric layer 250 covers the cap layer 240 and is between the memory elements 210A, 210B and 210C.

In some embodiments, the cap layer 240 is made of silicon nitride, silicon oxide, silicon oxynitride, or another suitable dielectric material. In some embodiments, the dielectric layer 250 is made of tetraethyl orthosilicate (TEOS), another suitable dielectric material, or a combination thereof. In some embodiments, the cap layer 240 and the dielectric layer 250 are deposited using a CVD process, a spin-on process, a spray coating process, another applicable process, or a combination thereof. In some embodiments, the deposited cap layer 240 and the deposited dielectric layer 250 cover the top electrodes 220. A planarization process is performed over the deposited dielectric layer 250 to partially remove the deposited cap layer 240 and the deposited dielectric layer 250 until the top electrodes 220 are exposed. The planarization process may include an etching back process, a CMP process, another applicable process, or a combination thereof.

Figure 1H:
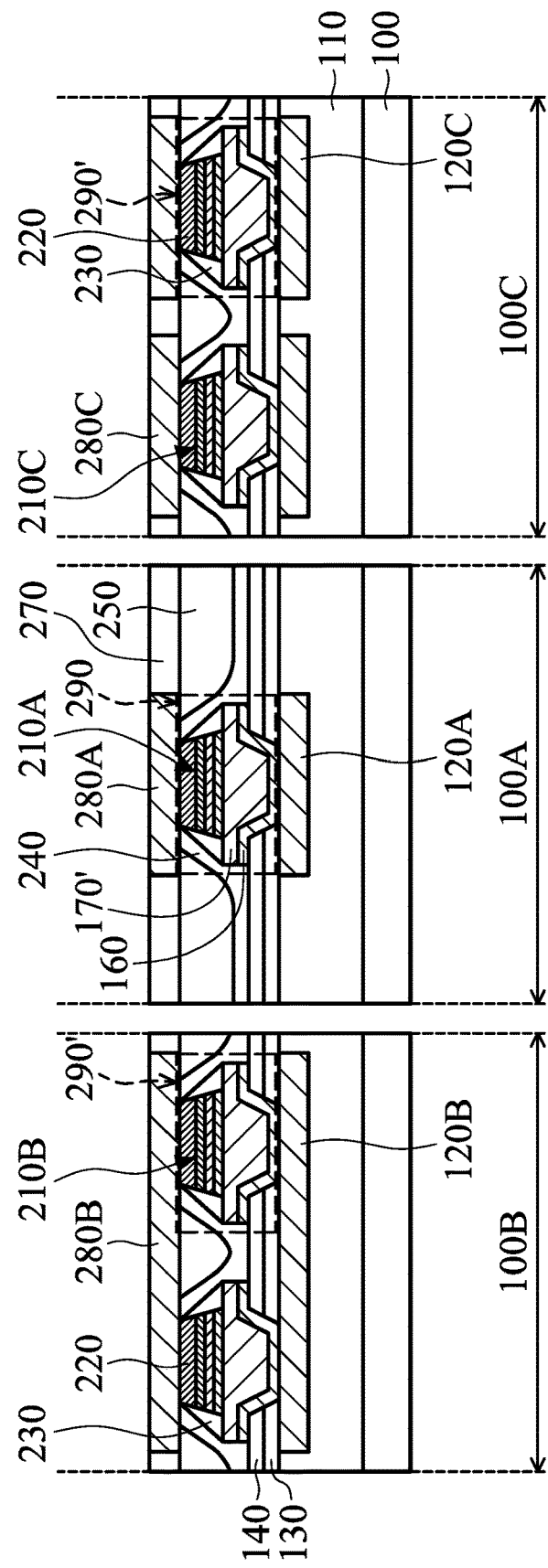

As shown in FIG. 1H, a dielectric layer 270 is deposited over the dielectric layer 250 in the memory region 100A and the peripheral regions 100B and 100C, in accordance with some embodiments. The dielectric layer 270 may serve as an IMD layer of an interconnection structure. In some embodiments, the dielectric layer 270 is made of silicon oxide, BSG, PSG, BPSG, FSG, porous dielectric material, another suitable low-k dielectric material, or a combination thereof. The material of the dielectric layer 270 is selected to minimize size, propagation delays, and crosstalk between nearby conductive features. In some embodiments, the dielectric layer 270 is deposited using a CVD process, a spin-on process, a spray coating process, another applicable process, or a combination thereof.

Afterwards, multiple conductive features are formed in the dielectric layer 270. As shown in FIG. 1H, conductive features including a conductive feature 280A are formed in the dielectric layer 270 in the memory region 100A. In some embodiments, the conductive features in the memory region 100A (such as the conductive feature 280A) include conductive lines, conductive pads or other suitable conductive features. The conductive feature 280A is an active conductive feature.

As shown in FIG. 1H, conductive features including a conductive feature 280B are formed in the dielectric layer 270 in the peripheral region 100B. In some embodiments, the conductive features in the peripheral region 100B (such as the conductive feature 280B) include conductive pads, conductive lines or other suitable conductive features. The conductive feature 280B may be an active or dummy conductive feature.

As shown in FIG. 1H, conductive features 280C are formed in the dielectric layer 270 in the peripheral region 100C. In some embodiments, the conductive features 280C may include conductive lines, conductive pads or other suitable conductive features. In some embodiments, the conductive features 280C are active or dummy conductive features. In some other embodiments, one of the conductive features 280C is an active conductive feature while another of the conductive features 280C is a dummy conductive feature.

The conductive features 280A, 280B and 280C may be formed using a single or dual damascene process. For example, multiple openings (not shown) are formed in the dielectric layer 270 in the memory region 100A and the peripheral regions 100B and 100C to expose the top electrodes 220. These openings may include trenches, vias, or a combination thereof. A conductive material is deposited over the dielectric layer 270 and fills the openings in the dielectric layer 270. Subsequently, a planarization process (e.g., a CMP process) is performed over the conductive material to remove the excess conductive material outside of the openings. As a result, the remaining conductive material in the openings in the dielectric layer 270 forms the conductive features 280A, 280B and 280C. Afterwards, one or more dielectric layers and conductive features may be formed on the dielectric layer 270 and the conductive features 280A, 280B and 280C to continue the formation of the integrated circuit structure.

As shown in FIG. 1H, active memory cells including an active memory cell 290 are formed in the memory region 100A while dummy memory cells 290' are formed in the peripheral regions 100B and 100C. The active memory cell 290 and the dummy memory cells 290' are shown by dashed lines in FIG. 1H. The active memory cell 290 in the memory region 100A is connected to and between the conductive features 120A and 280A. The dummy memory cells 290' in the peripheral regions 100B are connected to and between the conductive features 120B and 280B. In some embodiments, each of the conductive features 120B and 280B overlaps multiple dummy memory cells 290' in the peripheral regions 100B. The dummy memory cells 290' in the peripheral regions 100C are connected to and between the conductive features 120C and 280C.

Each of the active memory cell 290 and the dummy memory cells 290' includes a bottom electrode, a memory element, a top electrode and spacers, which are described in detail above. In some embodiments, the configuration of the dummy memory cells 290' is similar to or substantially the same as the configuration of the active memory cell 290.

According to some embodiments of the disclosure, the dummy memory cells 290' provide sufficient structural rigidity and support in the peripheral regions 100B and 100C. As a result, loading effect during manufacturing, such as during a planarization process, is reduced or eliminated. Accordingly, a flat and even surface can be formed in the memory region 100A and the peripheral regions 100B and 100C. Furthermore, conductive features in the peripheral regions 100B and 100C are prevented from being damaged so that short circuiting and/or high current leakage due to the loading effect are eliminated. In some embodiments, there is an alignment mark or overlay box (not shown) in the peripheral regions 100B and 100C. The dummy memory cells 290' in the peripheral regions 100B and 100C also protect the alignment mark and/or the overlay box from being polished and thus removed or damaged. As a result, it can be ensured that misalignment between multiple layers is minimized. It can be more precise to measure and control overlay offset during manufacturing. Therefore, the quality, reliability, and yield of the integrated circuit structure are greatly improved.

In some embodiments, the active memory cell 290 and the dummy memory cells 290' are concurrently formed at the same stage. Accordingly, inserting the dummy memory cells 290' into the integrated circuit structure does not require an extra mask or additional operations. The fabrication cost is low for the dummy memory cells 290'. The formation method described in the disclosure is flexible and can be compatible with CMOS BEOL semiconductor fabrication processes.

In addition, in some embodiments, the memory region 100A and the peripheral regions 100B and 100C together form a chip region of the integrated circuit structure. In some embodiments, a wafer acceptance test (WAT) is performed at a scribe-line region (not shown) outside the chip region of the integrated circuit structure. Due to the dummy memory cells 290', less or no damage is induced in the peripheral regions 100B and 100C during manufacturing. Furthermore, there may be similar or substantially the same element density in the memory region 100A and the peripheral regions 100B and 100C. Element density refers to the number of cells including the active memory cell 290 and the dummy memory cells 290' that are located within a given area. As a result, it can be ensured that the data shown by WAT is consistent with the actual performance of the chip region (such as the memory region 100A) and more reliable for monitoring fabrication processes.

As mentioned above, in some embodiments, the area of the conductive feature 120B is greater than that of the conductive features 120A and 120C. For example, the conductive feature 120B is a conductive pad. There are multiple dummy memory cells 290' connected to the same conductive feature (such as the conductive feature 120B or 280B), as shown in FIG. 1H. These dummy memory cells 290' are electrically coupled in parallel through the conductive features 120B and 280B. As a result, the resistivity of the integrated circuit structure is prevented from being increased. The integrated circuit structure may have a sufficiently low resistivity, such as about 1 ohm (Ω). Therefore, the device performance of the integrated circuit structure becomes better.

In some embodiments, multiple dummy memory cells 290' are arranged in an array (not shown) between the conductive features 120B and 280B. It should be noted that the number of dummy memory cells 290' connected to the same conductive feature can vary according to requirements. In some other embodiments, there is only one dummy memory cell 290' connected to the conductive features 120B and 280B.

Many variations and/or modifications can be made to embodiments of the disclosure. For example, in some other embodiments, additional operations can be provided during the stages described in FIGS. 1A-1H. FIGS. 2A-2D are cross-sectional views of various stages of a process for forming an integrated circuit structure, in accordance with some embodiments. In some embodiments, the materials and/or formation methods of the integrated circuit structure shown in FIGS. 1A-1H can also be applied in the embodiments illustrated in FIGS. 2A-2D, and are therefore not repeated.

Figure 2A:
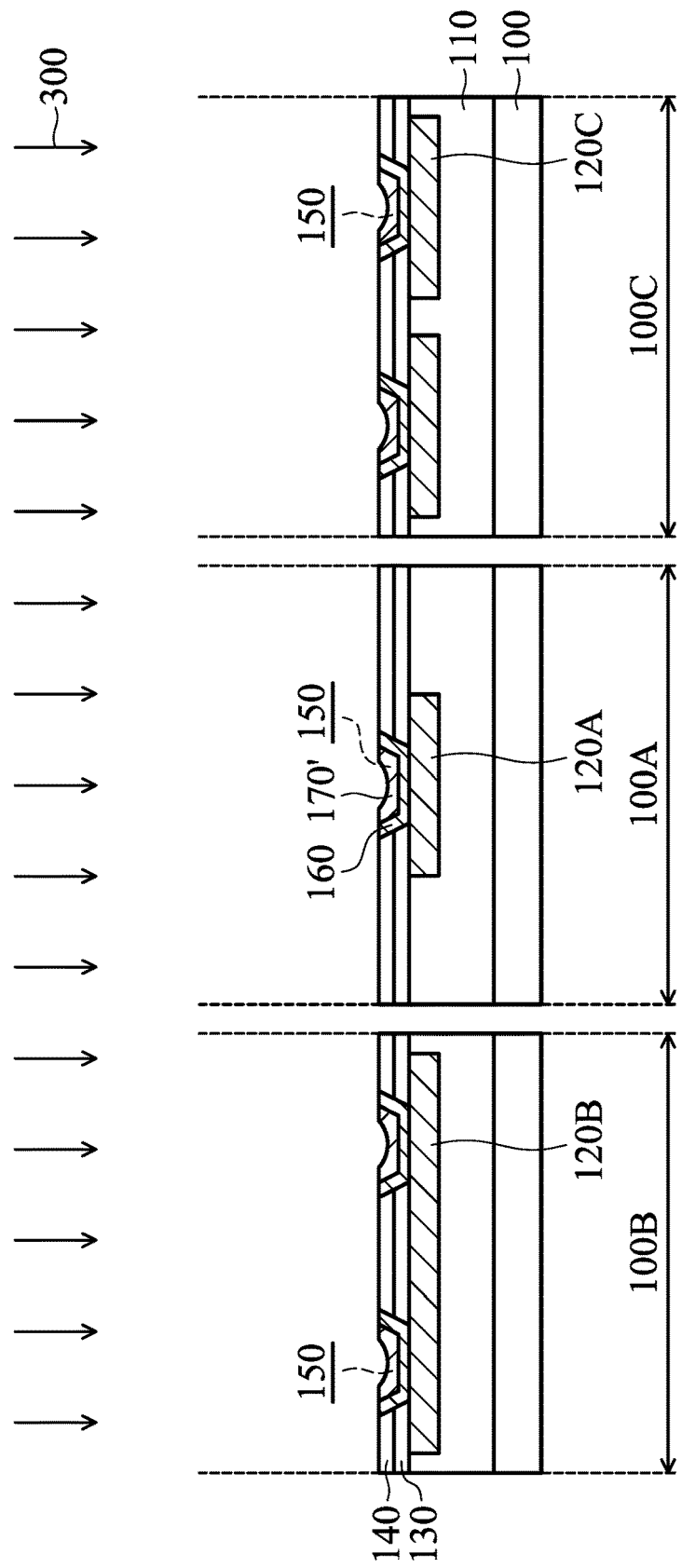
FIGS. 2A-2D are cross-sectional views of various stages of a process for forming an integrated circuit structure, in accordance with some embodiments.

In some embodiments, the planarization process 300 is performed over the conductive layer 170 (shown in FIG. 1D) until the dielectric layer 140 is exposed, as shown in FIG. 2A. The dielectric layer 140 serves as a stop layer of the planarization process 300. The conductive layer 170 and the barrier layer 160 are partially removed during the planarization process 300. As a result, the remaining portion of the conductive layer 170 in the openings 150 forms the conductive layer 170'. The conductive layer 170' may be recessed.

Figure 2B:
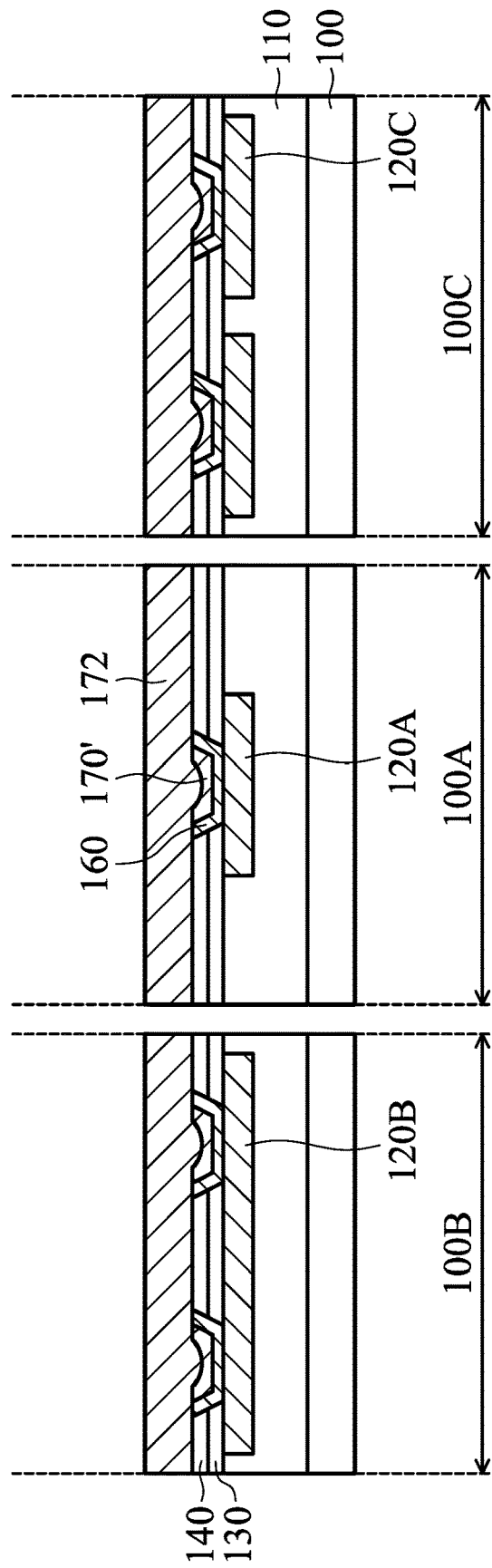

Afterwards, a conductive layer 172 is deposited over the dielectric layer 140 in the memory region 100A and the peripheral regions 100B and 100C, as shown in FIG. 2B in accordance with some embodiments. The conductive layer 172 fills the recessed conductive layer 170'. The conductive layer 172 may have non-uniform surface topography in the memory region 100A and the peripheral regions 100B and 100C.

In some embodiments, the conductive layer 172 includes a metal nitride, a metal, or another suitable conductive material. Examples of the metal nitride include TiN and TaN. Examples of the metal include Cu, Al, W, Ti and Ta. In some embodiments, the conductive layer 172 is deposited using a CVD process, an ALD process, a PVD process, another applicable process, or a combination thereof.

Figure 2C:
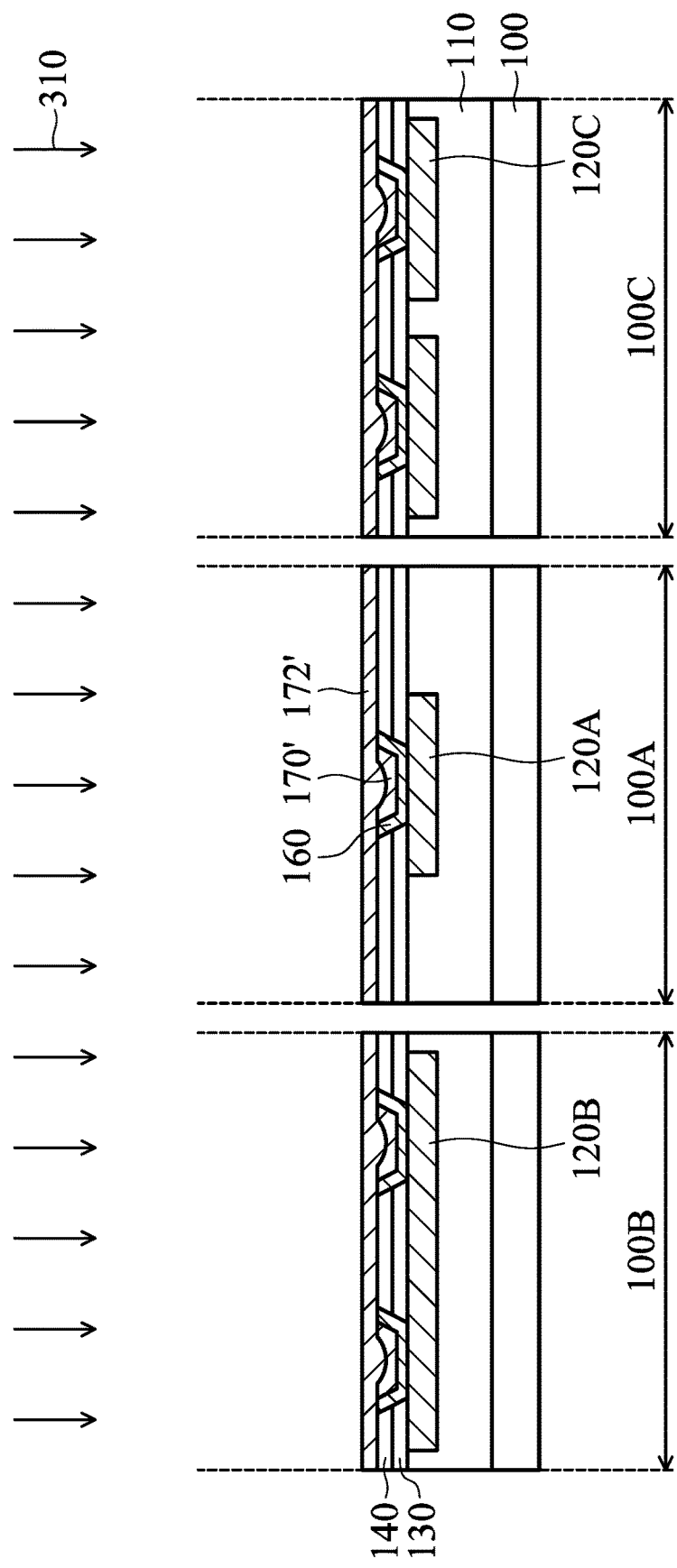

Afterwards, a planarization process 310 is performed over the conductive layer 172, as shown in FIG. 2C in accordance with some embodiments. The conductive layer 172 is partially removed and thinned until a planarized conductive layer 172' is formed. The planarization process 310 may include a CMP process, another applicable process, or a combination thereof. In some embodiments, the conductive layer 172' has a substantially uniform surface topography in the memory region 100A and the peripheral regions 100B and 100C. In some embodiments, the conductive layer 172' is in direct contact with the dielectric layer 140.

Figure 2D:
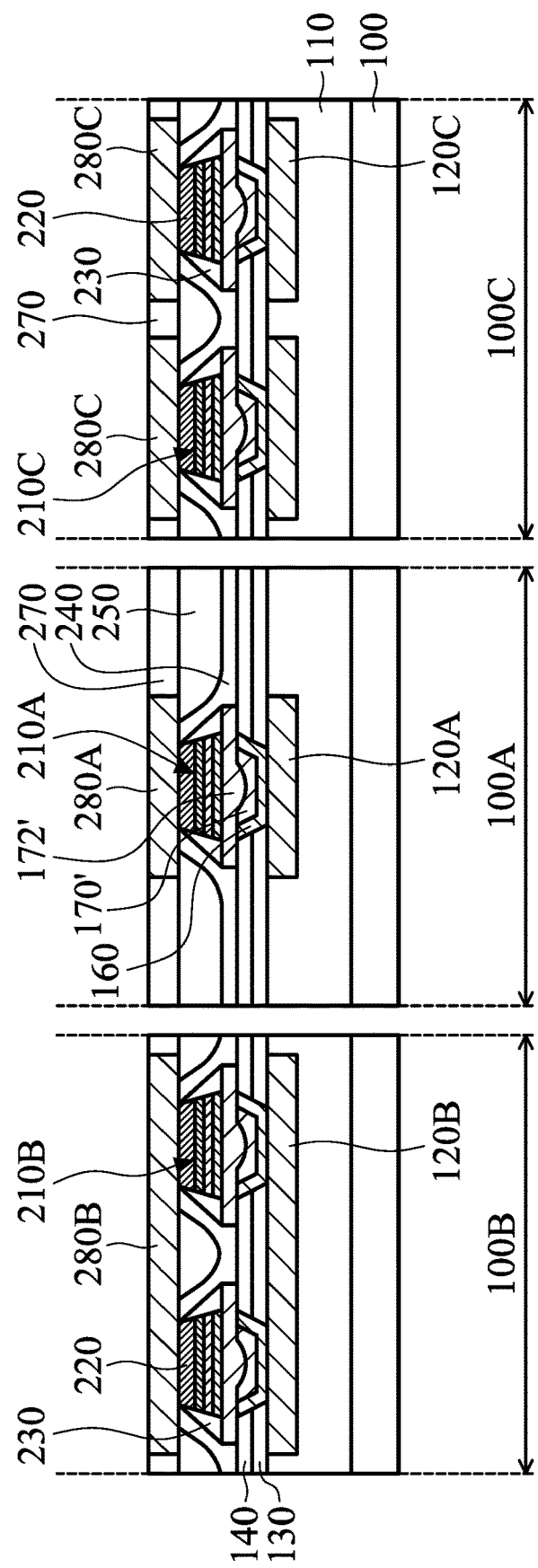

The steps described in FIGS. 1E-1H are sequentially performed over the structure shown in FIG. 2C to continue the formation of the integrated circuit structure, as shown in FIG. 2D. In some embodiments, the patterned conductive layer 172' and the conductive layer 170' together form multiple bottom electrodes in the memory region 100A and the peripheral regions 100B and 100C. Alternatively, the combination of the conductive layer 172', the conductive layer 170' and the barrier layer 160 may be referred to as a bottom electrode. According to some embodiments of the disclosure, the dummy memory cells 290' reduce or eliminate the loading effect during multiple planarization processes. Therefore, the integrated circuit structure shown in FIG. 2D has better reliability.

Although FIG. 1B shows that each of the conductive features 120A, 120B and 120C is partially exposed through one or more of the openings 150, embodiments of the disclosure are not limited thereto. One of the conductive features 120B and 120C may not be exposed through one of the openings 150. FIGS. 3A-3D are cross-sectional views of various stages of a process for forming an integrated circuit structure, in accordance with some embodiments. In some embodiments, the materials and/or formation methods of the integrated circuit structure shown in FIGS. 1A-1H can also be applied in the embodiments illustrated in FIGS. 3A-3D, and are therefore not repeated.

Figure 3A:
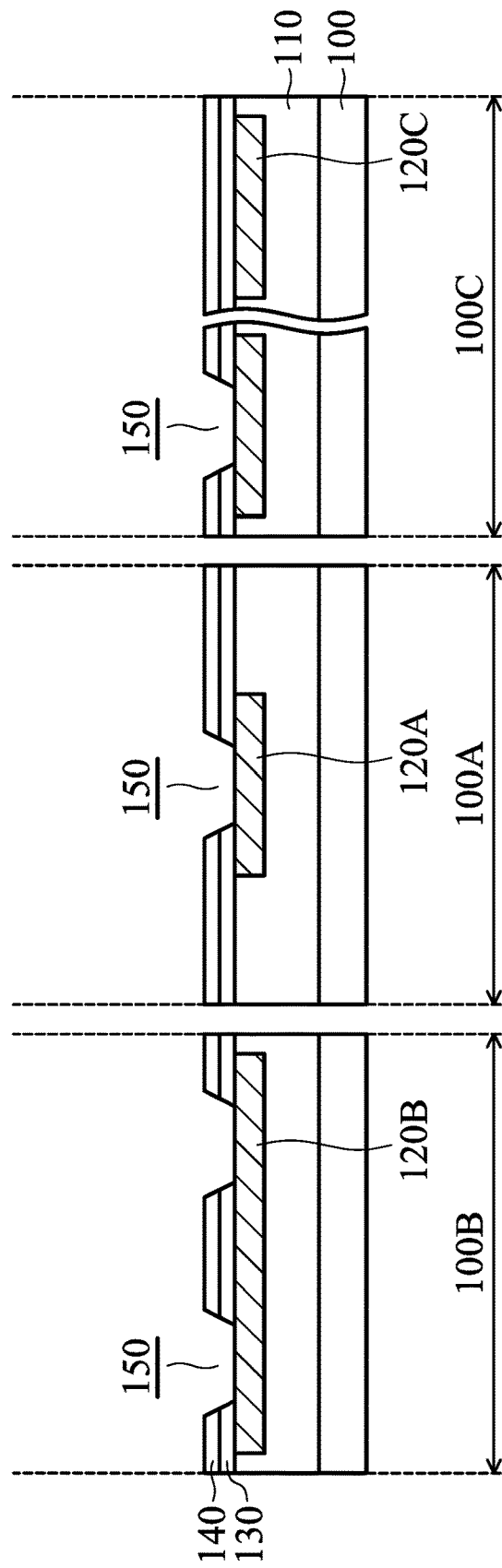
FIGS. 3A-3D are cross-sectional views of various stages of a process for forming an integrated circuit structure, in accordance with some embodiments.

As shown in FIG. 3A, one of the conductive features 120C in the peripheral region 100C is covered by the anti-reflective layer 130 and the dielectric layer 140 after the formation of the openings 150, in accordance with some embodiments. The covered conductive feature 120C may be an active conductive feature. In some embodiments, another of the conductive features 120C in the peripheral region 100C is partially exposed by one of the openings 150. The exposed conductive feature 120C may be a dummy conductive feature and electrically isolated from the conductive feature 120A.

Figure 3B:
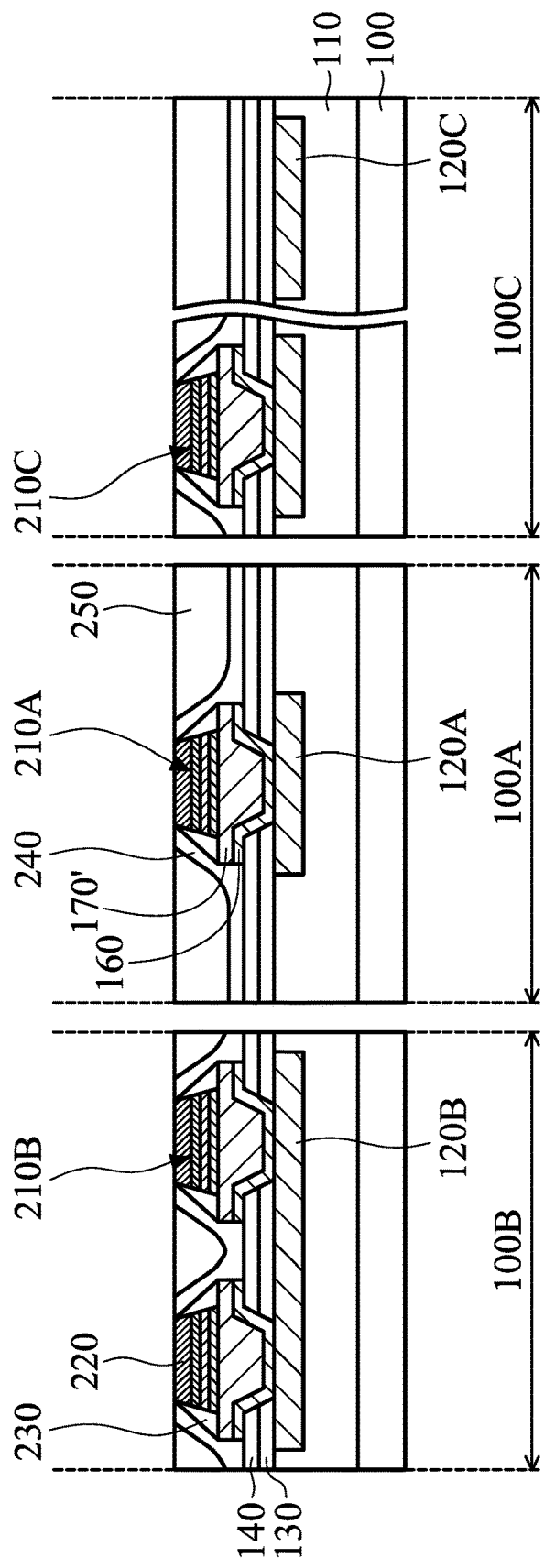

Afterwards, the steps described in FIGS. 1C-1G are sequentially performed over the structure shown in FIG. 3A. In some embodiments, one of the conductive features 120C in the peripheral region 100C remains covered after the deposition of the dielectric layer 250, as shown in FIG. 3B. No memory element is formed on the covered conductive feature 120C.

Figure 3C:
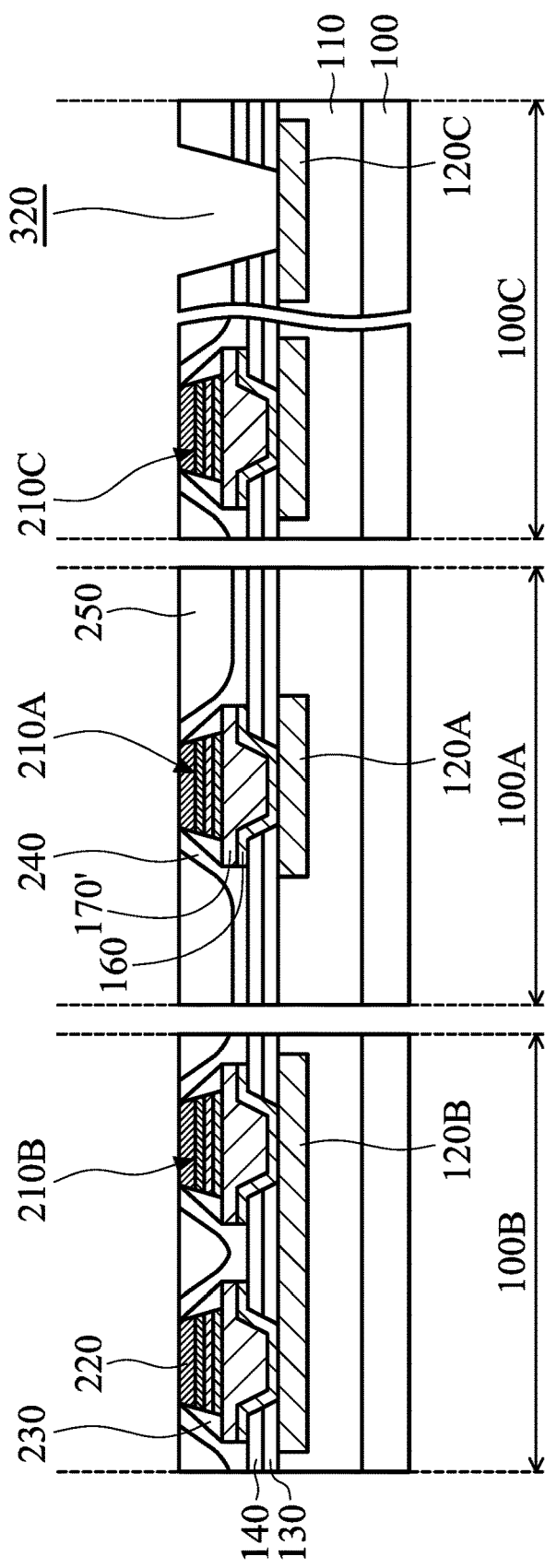

As shown in FIG. 3C, an opening 320 is formed in the peripheral region 100C, in accordance with some embodiments. The opening 320 penetrates through the dielectric layer 250, the cap layer 240, the dielectric layer 140 and the anti-reflective layer 130. As a result, one of the conductive features 120C, which was previously covered by the dielectric layer 250, the cap layer 240, the dielectric layer 140 and the anti-reflective layer 130, becomes partially exposed. The opening 320 may be referred to as a via hole. In some embodiments, the opening 320 is formed using photolithography and etching processes, another applicable process, or a combination thereof. The anti-reflective layer 130 may serve as a stop layer during an etching process for forming the opening 320.

Subsequently, the steps described in FIG. 1H are performed over the structure shown in FIG. 3C. For example, the dielectric layer 270 is deposited over the dielectric layer 250 in the memory region 100A and the peripheral regions 100B and 100C. In some embodiments, the opening 320 is filled with the dielectric layer 270. Afterwards, multiple openings (not shown) are formed in the dielectric layer 270 in the memory region 100A and the peripheral regions 100B and 100C to expose the top electrodes 220. These openings may include trenches, vias, or a combination thereof. The dielectric layer 270 in the opening 320 is also removed.

Figure 3D:
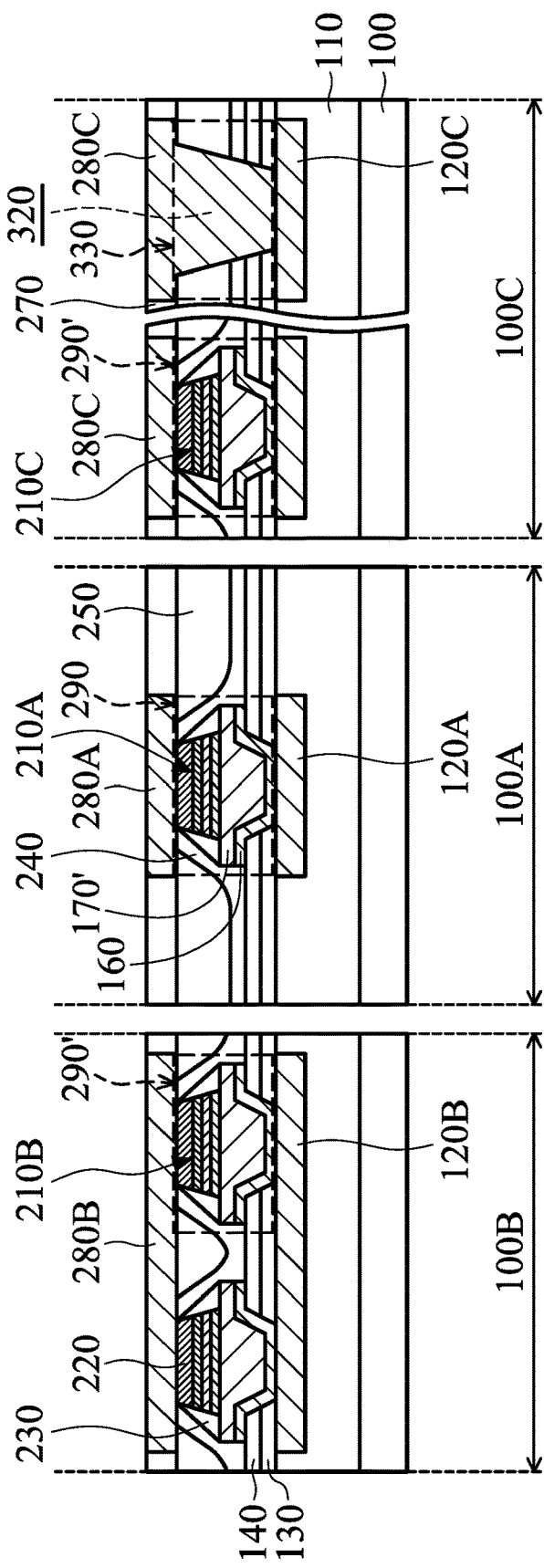

Subsequently, a conductive material is deposited over the dielectric layer 270 and fills the openings in the dielectric layer 270 and the opening 320. A planarization process (e.g., a CMP process) is performed over the conductive material to remove the excess conductive material. As a result, the remaining conductive material in the openings in the dielectric layer 270 forms the conductive features 280A, 280B and 280C. The remaining conductive material in the opening 320 forms a conductive feature 330, as shown in FIG. 3D. The conductive feature 330 may be referred to as a conductive via or an active via.

In some embodiments, the conductive feature 330 penetrates through the dielectric layer 250, the cap layer 240, the dielectric layer 140 and the anti-reflective layer 130 so as to electrically connect to one of the conductive features 120C. In some embodiments, the active memory cell 290, the dummy memory cells 290' and the conductive feature 330 are at substantially the same level. In some embodiments, the active memory cell 290, the dummy memory cells 290' and the conductive feature 330 have substantially the same thickness or height. The thickness or height may be measured from the top surface of the dielectric layer 110 to the bottom surface of the dielectric layer 270.

As mentioned above, in some embodiments, there is a non-uniform surface topography in the memory region 100A and the peripheral regions 100B and 100C. As a result, the active memory cell 290, the dummy memory cells 290' and the conductive feature 330 may be positioned at locations with different heights. In some embodiments, the distance between the conductive feature 330 and one of the dummy memory cells 290' is greater than the distance between two of the dummy memory cells 290'.

According to some embodiments of the disclosure, the conductive feature 330, which is different from the dummy memory cells 290', is formed in the peripheral region 100C. The conductive feature 330 is electrically coupled to active conductive features 120C and 280C. As a result, the resistivity of the integrated circuit structure is prevented from being increased. The integrated circuit structure can have a sufficiently low resistivity. Therefore, the integrated circuit structure performs well.

Many variations and/or modifications can be made to embodiments of the present disclosure. For example, although FIGS. 1A-1H, 2A-2D and 3A-3D show an integrated circuit structure having a memory element with a MTJ structure, embodiments of the disclosure are not limited thereto. Some other embodiments of the disclosure include an integrated circuit structure having a memory element with any suitable structure.

Embodiments of the disclosure form an integrated circuit structure with a memory element and a dummy element. The integrated circuit structure includes a memory region and a peripheral region. The memory element is in the memory region and the dummy element is in the peripheral region. In some embodiments, the memory element and the dummy element are at substantially the same level and concurrently formed using the same process at the same stage. The dummy element provides sufficient structural rigidity and support in the peripheral region so that the peripheral region is protected from damage during manufacturing, such as during a planarization process. The loading effect of a planarization process is reduced. As a result, short circuiting and/or high current leakage, which may be induced in the peripheral region by the loading effect, are mitigated or eliminated. Therefore, embodiments of the disclosure provide an integrated circuit structure with good device performance and reliability.

In accordance with some embodiments, an integrated circuit structure is provided. The integrated circuit structure includes a dielectric layer in a memory region and a logic region. The integrated circuit structure also includes a first conductive feature in the dielectric layer in the memory region. The integrated circuit structure further includes a second conductive feature in the dielectric layer in the logic region. In addition, the integrated circuit structure includes an active memory cell over the dielectric layer in the memory region. The active memory cell is connected to the first conductive feature. The integrated circuit structure also includes a first dummy memory cell over the dielectric layer in the logic region. The first dummy memory cell is connected to the second conductive feature.

In accordance with some embodiments, an integrated circuit structure is provided. The integrated circuit structure includes a substrate including a memory region and a peripheral region adjacent to the memory region. The integrated circuit structure also includes a first bottom electrode over the substrate in the memory region. The integrated circuit structure further includes a second bottom electrode over the substrate in the peripheral region. The first bottom electrode and the second bottom electrode are at substantially the same level. In addition, the integrated circuit structure includes an active memory element covering the first bottom electrode in the memory region. The integrated circuit structure also includes a dummy memory element covering the second bottom electrode in the peripheral region.

In accordance with some embodiments, a method for forming an integrated circuit structure is provided. The method includes forming a first conductive feature in a memory region and a second conductive feature in a peripheral region. The method also includes forming a dielectric layer in the memory region and the peripheral region. The dielectric layer covers the first conductive feature and the second conductive feature. The method further includes partially removing the dielectric layer to form a first opening in the memory region and a second opening in the peripheral region. The first opening exposes the first conductive feature and the second opening exposes the second conductive feature. In addition, the method includes depositing a conductive layer over the dielectric layer to fill the first opening and the second opening. The method also includes planarizing the conductive layer. The method further includes forming memory elements over the conductive layer in the memory region and the peripheral region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming an integrated circuit structure, comprising:
    forming a first conductive feature in a memory region and a second conductive feature in a peripheral region;
    forming a dielectric layer in the memory region and the peripheral region, wherein the dielectric layer covers the first conductive feature and the second conductive feature;
    partially removing the dielectric layer to form a first opening in the memory region and a second opening in the peripheral region, wherein the first opening exposes the first conductive feature and the second opening exposes the second conductive feature;
    depositing a first conductive layer over the dielectric layer to fill the first opening and the second opening;
    planarizing the first conductive layer until the dielectric layer is exposed;
    depositing a second conductive layer covering the first conductive layer and the dielectric layer;
    forming memory elements over the second conductive layer in the memory region and the peripheral region;
    forming top electrodes covering the memory elements in the memory region and the peripheral region; and
    forming a cap layer over the dielectric layer to cover sidewalls of the second conductive layer in the memory region and the peripheral region, wherein top surfaces of the top electrodes are substantially level with a top surface of the cap layer.

2. The method for forming an integrated circuit structure as claimed in claim 1, further comprising:
    forming a barrier layer in the first opening in the memory region and the second opening in the peripheral region before the deposition of the first conductive layer; and
    patterning the barrier layer before the formation of the memory elements.

3. The method for forming an integrated circuit structure as claimed in claim 1, further comprising:
    planarizing the second conductive layer before the formation of the memory elements; and
    patterning the second conductive layer to form bottom electrodes after the formation of the memory elements.

4. The method for forming an integrated circuit structure as claimed in claim 1, further comprising:
    forming a third conductive feature in the peripheral region, wherein the third conductive feature is covered by the dielectric layer after the formation of the first opening and the second opening;
    partially removing the dielectric layer to form a third opening in the peripheral region after the formation of the memory elements, wherein the third opening exposes the third conductive feature; and
    filling the third opening with a third conductive layer to form a conductive via.

5. The method for forming an integrated circuit structure as claimed in claim 1, further comprising:
    patterning the second conductive layer to form bottom electrodes in the memory region and the peripheral region.

6. The method for forming an integrated circuit structure as claimed in claim 5, further comprising:
    forming spacers covering sidewalls of the memory elements and the top electrodes in the memory region and the peripheral region before the patterning of the second conductive layer.

7. The method for forming an integrated circuit structure as claimed in claim 6, wherein the patterning of the second conductive layer comprises etching the second conductive layer using the spacers and the top electrodes as an etching mask.

8. The method for forming an integrated circuit structure as claimed in claim 6, wherein the cap layer is vertically overlapped with the spacers and the second conductive layer.

9. The method for forming an integrated circuit structure as claimed in claim 5, further comprising:
    forming a second dielectric layer covering the cap layer between the memory elements in the memory region and the peripheral region.

10. A method for forming an integrated circuit structure, comprising:
    forming an active conductive feature in a memory region and a dummy conductive feature in a logic or test region;
    forming an anti-reflective layer in the memory region and the logic or test region;
    forming a dielectric layer covering the anti-reflective layer;
    forming a first opening, a second opening and a third opening in the anti-reflective layer and the dielectric layer, wherein the first opening exposes the active conductive feature, the second opening and the third opening exposes the dummy conductive feature;
    depositing a conductive layer over the dielectric layer to fill the first opening, the second opening and the third opening with a first portion, a second portion and a third portion of the conductive layer, respectively, wherein the second and the third portion of the conductive layer are formed over a continuous top surface of the dummy conductive feature;
    polishing the first conductive layer, the second conductive layer and the third conductive layer such that a top surface of the conductive layer is substantially flat in the memory region and the logic or test region; and
    forming an active magnetic tunnel junction (MTJ) structure over the first portion of the conductive layer in the memory region and a first dummy MTJ structure and a second dummy MTJ over the second portion and the third portion of the conductive layer in the logic or test region, respectively.

11. The method for forming an integrated circuit structure as claimed in claim 10, wherein the formation of the active MTJ structure, the first dummy MTJ structure and the second dummy MTJ structure comprises:
    forming a bottom ferromagnetic layer in the memory region and the logic or test region after the polishing of the conductive layer;
    forming a tunnel barrier layer covering the bottom ferromagnetic layer in the memory region and the logic or test region; and
    forming a top ferromagnetic layer covering the tunnel barrier layer in the memory region and the logic or test region.

12. The method for forming an integrated circuit structure as claimed in claim 10, further comprising:
    forming top electrodes covering the active MTJ structure, the first dummy MTJ structure and the second dummy MTJ structure after the polishing of the conductive layer;
    forming spacers in the memory region and the logic or test region to cover sidewalls of the active MTJ structure, the first dummy MTJ structure and the top electrodes; and patterning the conductive layer to form bottom electrodes in the memory region and the logic or test region.

13. The method for forming an integrated circuit structure as claimed in claim 10, wherein the second dummy MTJ structure and the first dummy MTJ structure are connected to the dummy conductive feature.

14. The method for forming an integrated circuit structure as claimed in claim 10, further comprising:
forming an additional conductive feature in the logic or test region after the formation of the active MTJ structure, the first dummy MTJ structure and the second dummy MTJ structure, wherein the additional conductive feature overlaps the first dummy MTJ structure and the second dummy MTJ structure.

15. The method for forming an integrated circuit structure as claimed in claim 10, further comprising:
forming a fourth opening penetrating through the anti-reflective layer and the dielectric layer in the logic or test region after the formation of the active MTJ structure, the first dummy MTJ structure and the second dummy MTJ structure; and
forming a conductive via in the fourth opening in the logic or test region, wherein the conductive via laterally overlaps the first dummy MTJ structure and the second dummy MTJ structure.

16. A method for forming an integrated circuit structure, comprising:
forming a first conductive feature in a memory region and a second conductive feature in a logic or test region;
forming a dielectric layer in the memory region and the logic or test region, wherein the dielectric layer has a first opening exposing the first conductive feature and a second opening exposing second conductive feature;
forming a barrier layer to cover the dielectric layer to fill the first opening and the second opening;
forming a first conductive layer covering the barrier layer;
polishing the first conductive layer and the barrier layer until the dielectric layer becomes exposed;
forming a second conductive layer covering the first conductive layer, the barrier layer and the dielectric layer after the polishing of the first conductive layer and the barrier layer;
polishing the second conductive layer to thin down the second conductive layer; and
forming an active memory element and a first dummy memory element covering the second conductive layer in the memory region and the logic or test region, respectively.

17. The method for forming an integrated circuit structure as claimed in claim 16, wherein the dielectric layer serves as a stop layer during the polishing of the first conductive layer and the barrier layer.

18. The method for forming an integrated circuit structure as claimed in claim 16, wherein the first conductive layer becomes recessed in the first opening and the second opening during the polishing of the first conductive layer and the barrier layer, and wherein the second conductive layer partially fills a recess of the first conductive layer.

19. The method for forming an integrated circuit structure as claimed in claim 16, wherein the dielectric layer remains covered by the second conductive layer during the polishing of the second conductive layer, and wherein the second conductive layer has a substantially even surface topography in the memory region and the logic or test region.

20. The method for forming an integrated circuit structure as claimed in claim 16, further comprising:
forming a second dummy memory element covering the second conductive layer and the first conductive layer in the logic or test region during the formation of the active memory element and the first dummy memory element, wherein the second conductive feature vertically overlap the second dummy memory element and the first dummy memory element.

* * * * *